(12) United States Patent
Seryogin et al.

(10) Patent No.: US 9,355,864 B2
(45) Date of Patent: May 31, 2016

(54) METHOD FOR INCREASING ADHESION OF COPPER TO POLYMERIC SURFACES

(71) Applicants: TEL NEXX, Inc., Billerica, MA (US); TEL Epion Inc., Billerica, MA (US)

(72) Inventors: Georgiy Seryogin, Watertown, MA (US); Thomas G. Tetreault, Manchester, NH (US); Stephen N. Golovato, Lexington, MA (US); Ramya Chandrasekaran, Acton, MA (US)

(73) Assignees: TEL NEXX, INC., Billerica, MA (US); TEL EPION INC., Billerica, MA (US)

( * ) Notice: Subject to any disclaimer, the term of this patent is extended or adjusted under 35 U.S.C. 154(b) by 0 days.

(21) Appl. No.: 14/308,420

(22) Filed: Jun. 18, 2014

(65) Prior Publication Data

US 2015/0044871 A1   Feb. 12, 2015

Related U.S. Application Data

(60) Provisional application No. 61/862,735, filed on Aug. 6, 2013.

(51) Int. Cl.
| | |
|---|---|
| *H01L 21/44* | (2006.01) |
| *H01L 21/3205* | (2006.01) |
| *H01L 23/532* | (2006.01) |
| *H01L 21/285* | (2006.01) |
| *H01L 23/552* | (2006.01) |

(52) U.S. Cl.
CPC ...... *H01L 21/32051* (2013.01); *H01L 21/2855* (2013.01); *H01L 23/53233* (2013.01); *H01L 23/53238* (2013.01); *H01L 23/552* (2013.01)

(58) Field of Classification Search
None
See application file for complete search history.

(56) References Cited

U.S. PATENT DOCUMENTS

| | | | |
|---|---|---|---|
| 3,930,975 A | 1/1976 | Siegle et al. | |
| 4,765,860 A | 8/1988 | Ueno et al. | |
| 4,886,681 A | 12/1989 | Clabes et al. | |
| 5,137,791 A | 8/1992 | Swisher | |
| 5,178,962 A * | 1/1993 | Miyamoto et al. | 428/463 |
| 5,372,848 A | 12/1994 | Blackwell et al. | |
| 5,527,566 A | 6/1996 | Schadt et al. | |
| 5,557,142 A | 9/1996 | Gilmore et al. | |
| 6,171,661 B1 | 1/2001 | Zheng et al. | |

(Continued)

FOREIGN PATENT DOCUMENTS

TW   201005911 A1   2/2010

OTHER PUBLICATIONS

Office Action mailed Sep. 10, 2015 in corresponding Taiwan Patent Application No. 103126802 (with an English translation) (13 pages).

*Primary Examiner* — Reema Patel
(74) *Attorney, Agent, or Firm* — Rothwell, Figg, Ernst & Manbeck, P.C.

(57) ABSTRACT

Techniques disclosed herein a method and system for conditioning a polymeric layer on a substrate to enable adhesion of a metal layer to the polymeric layer. Techniques may include conditioning the polymeric layer with nitrogen-containing plasma to generate a nitride layer on the surface of the polymeric layer. In another embodiment, the conditioning may include depositing a CuN layer using a lower power copper sputtering process in a nitrogen rich environment. Following the condition process, a higher power copper deposition or sputtering process may be used to deposit copper onto the polymeric layer with good adhesion properties.

20 Claims, 5 Drawing Sheets

(56) References Cited

U.S. PATENT DOCUMENTS

| | | |
|---|---|---|
| 6,348,738 B1 | 2/2002 | Dery et al. |
| 7,829,981 B2 * | 11/2010 | Hsu ................ 257/660 |
| 7,928,538 B2 | 4/2011 | Salzman |
| 8,004,068 B2 | 8/2011 | Tang et al. |
| 8,030,750 B2 | 10/2011 | Kim et al. |
| 8,576,574 B2 | 11/2013 | Wong et al. |
| 2010/0013064 A1 | 1/2010 | Hsu |
| 2010/0052171 A1 * | 3/2010 | Ito et al. ................ 257/751 |
| 2011/0114375 A1 * | 5/2011 | Ohmi et al. ............ 174/257 |
| 2011/0127654 A1 | 6/2011 | Weng et al. |
| 2012/0188727 A1 | 7/2012 | Lin et al. |
| 2013/0033671 A1 | 2/2013 | Schadt et al. |
| 2013/0082367 A1 | 4/2013 | Yoo |
| 2013/0082368 A1 | 4/2013 | Kim et al. |
| 2013/0149445 A1 | 6/2013 | Guenther et al. |
| 2014/0283913 A1 * | 9/2014 | Whitelegg et al. ...... 136/260 |

* cited by examiner

METHOD FOR INCREASING ADHESION OF COPPER TO POLYMERIC SURFACES

CROSS REFERENCE TO RELATED APPLICATION

Pursuant to 37 C.F.R. §1.78(a)(4), this application claims the benefit of and priority to prior filed Provisional Application Ser. No. 61/862,735 filed Aug. 6, 2013, which is expressly incorporated herein by reference.

BACKGROUND OF THE INVENTION

Techniques disclosed herein relate to semiconductor fabrication, and more particularly to depositing metal onto a surface of a workpiece or a substrate that may have an exposed polymeric surface.

In semiconductor manufacturing, metal films may be sputtered by physical vapor deposition (PVD) process onto a variety of surfaces such as silicon, passivation coatings, other metals, and polymer coatings among others. In general, adhesion of most metals to polymer surfaces is poor. Developing special surface treatments or certain processing conditions that may be used to improve metal adhesion to polymer surfaces may be desirable.

SUMMARY

Generally, a polymeric layer is not conducive to adhering of a metal layer. However, the polymeric layer may be treated or conditioned to improve metal layer adhesion. The treatment or conditioning may include generating an adhesion layer that adheres to the polymeric layer and an overlying metal layer and/or treating the surface of the polymeric layer to increase adhesion of the overlying metal layer. One particular application may include the deposition of a metal layer, such as copper (Cu), onto the surface of molded integrated circuit (IC) packages to provide electro-magnetic interference (EMI) shielding. Cu deposited using conventional physical vapor deposition (PVD) techniques may exhibit poor adhesion to the underlying layer (e.g., IC package surface) and a pre-treatment process may be used to improve adhesion.

Exposure of the polymeric layer to a gaseous environment containing nitrogen may improve adhesion of various metals. In one embodiment, a two-step metal deposition process may be used to deposit a metal layer on the polymeric layer. In the first step, a nitrogen and argon gas mixture may be used during a lower power deposition step to promote adhesion between the polymeric layer and the metal layer. Nitrogen-containing species, including but not limited to, atomic nitrogen (N), diatomic nitrogen ($N_2$), atomic nitrogen ions ($N^+$), diatomic nitrogen ions ($N_2^+$), metastable nitrogen ($N^*, N_2^*$), etc., may impact, interact and/or embed in the polymeric layer to change the surface conditions or energy in a way that improves metal adhesion. In another embodiment, a thin layer of metal may also be deposited at a low deposition rate in the presence of nitrogen-argon plasma to produce a modified interface for the metal film to be deposited on. In the second step, a metal layer may be deposited on top of the conditioned polymeric layer using a higher power deposition step. In this instance, the gas mixture may include argon and substantially less nitrogen, if at all, than the first step. As a result, the metal concentration of this metal layer may higher than any metal that may have been deposited in the presence of the nitrogen-argon plasma.

In one embodiment, a physical vapor deposition (PVD) chamber may be used to generate the adhesion layer on the polymeric layer followed by the overlying metal layer. However, in another embodiment, a plasma etch chamber may be used to generate the adhesion layer and the PVD chamber may be used to generate the overlying metal layer. The PVD chamber and the plasma etch chamber may be co-located on the same tool or they may each be used on separate tools.

During the first step, the PVD chamber may use a nitrogen gas mixture coupled with a low magnetron or radio frequency (RF) power to ionize the nitrogen. The neutral and ionized nitrogen constituents may contact or become embedded in the polymeric layer and improve metal adhesion of the polymeric layer. In one embodiment, the nitrogen gas mixture may include up to 50% argon. The power applied to the magnetron or the electrode may be less than or equal to 2 $W/cm^2$. In one specific embodiment, the applied power may be approximately 0.1 $W/cm^2$. In another embodiment, the PVD chamber may also deposit a small amount of copper during the nitrogen gas mixture ionization. The process pressure may range between 1-20 mTorr and more particularly between 2-15 mTorr. This may result in a deposited layer of 10-500 A of copper nitride on the polymeric layer.

In a plasma etch chamber embodiment, a low energy plasma source may ionize or dissociate the molecular nitrogen gas In one embodiment, the polymeric substrate can be transferred in-situ to the PVD chamber for metal deposition. In this instance, the polymeric substrate is transferred to the PVD chamber without exposure to the ambient atmosphere.

During the second step, the PVD chamber may continue to deposit copper onto the adhesion layer using an argon dominant gas mixture and a power setting that is greater than 2 $W/cm^2$ up to 20 $W/cm^2$. In one specific embodiment, the second step copper layer may exceed about 1 µm.

BRIEF DESCRIPTION OF THE DRAWINGS

The advantages of the technology described above, together with further advantages, may be better understood by referring to the following description taken in conjunction with the accompanying drawings. In the drawings, like reference characters generally refer to the same parts throughout the different views. The drawings are not necessarily to scale, emphasis instead generally being placed upon illustrating the principles of the technology.

DETAILED DESCRIPTION

Figure 1:
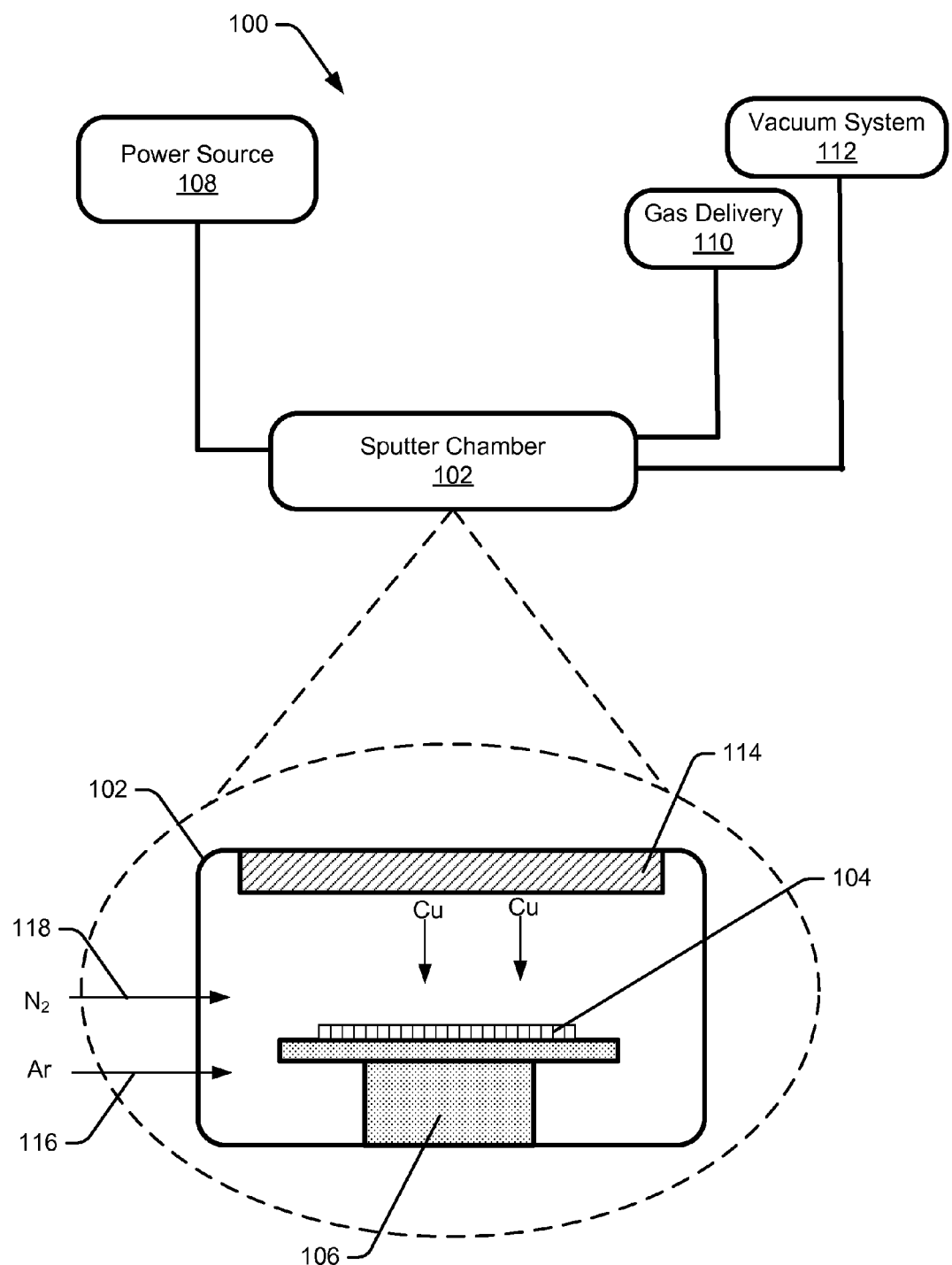
FIG. 1 illustrates a schematic of a PVD chamber that may be used to generate an adhesion layer and a metal layer on a polymeric substrate.

Although the present invention will be described with reference to the embodiments shown in the drawings, it should be understood that the present invention can be embodied in many alternate forms of embodiments. In addition, any suitable size, shape or type of elements or materials could be used. For example, while polymeric-metal structures are described, the method and apparatus described herein may be applicable to other microscale features.

FIG. 1 illustrates a schematic of processing tool 100 that may include a PVD chamber 102 that may be used to generate an adhesion layer (not shown) and a metal layer (not shown) on a polymeric substrate 104 coupled to a substrate chuck 106. The PVD chamber 102 may be coupled to power source 108, a gas delivery system 110, and a vacuum system 112.

The power source 108 may be connected to a metal source or target 114 that may provide the metal that may be deposited or sputtered on to the polymeric substrate 106. In one embodiment, the metal source 114 may include copper in one or more variations and concentrations. The power source 108 may apply power (e.g., 1 W/cm$^2$ up to 20 W/cm$^2$) to the metal source 114 to enable the deposition or sputtering of copper ions towards the polymeric substrate 106 as indicated by the Cu arrows in FIG. 1. In conjunction with the power source 108, the vacuum system 112 may maintain a process pressure of 2-15 mT during the sputtering process and the gas delivery system 110 may also provide an argon gas 116 to maintain an argon environment during the sputtering process. In addition to the sputtering process, the PVD chamber 102 may also be used to condition and/or to deposit an adhesion layer on the polymeric substrate 104.

Generally, the conditioning or the adhesion layer may be done using a nitrogen gas mixture and a lower power applied to the metal source 114 in comparison with the sputtering process described immediately above. In one embodiment, the nitrogen gas 118 may be mixed with the argon gas 116 up to 50%. The power source 108 may apply power to the metal source 114 up to 20 W/cm2, during the conditioning process. The process pressure may vary between 1 mTorr and 20 mTorr. The concentration of nitrogen and/or copper in the adhesion layer may vary with different gas flows, power, and pressure. In one embodiment, the concentration of nitrogen and argon gas is controlled by the gas flow rates into the chamber (e.g., Ar 116, $N_2$ 118). The gas flow rates may be controlled via a mass flow controller. However, the concentration of gas may also be controlled by other means that may include, but is not limited to, sampling PVD chamber 102 to determine the amount of $N_2$ and Ar that is present.

Figure 2:
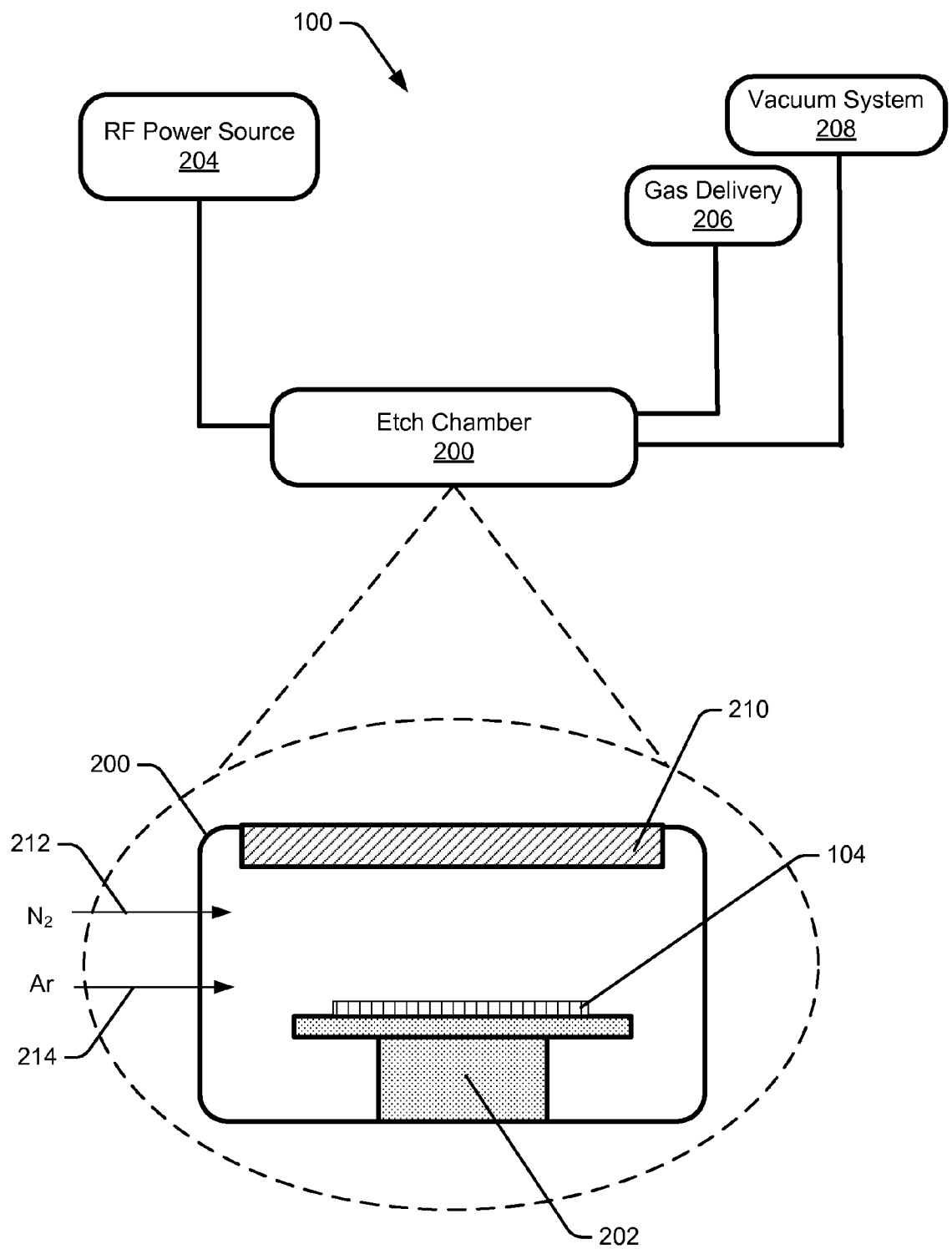
FIG. 2 illustrates a schematic of a plasma etch chamber that may be used to condition a polymeric substrate for adhering a metal layer.

In another embodiment, the polymeric substrate 104 conditioning may be achieved by using a plasma etch chamber 200, as shown FIG. 2, that may be coupled to the processing tool 100. The polymeric substrate 104 may be placed on or coupled to the plasma substrate chuck 202. The plasma etch chamber 200 may be coupled to a radio frequency (RF) power source 204, a gas delivery system 206, and a vacuum system 208.

In one embodiment, the conditioning process may include a nitrogen 212 and argon 214 gas mixture that enables a nitrogen rich processing environment. The vacuum system 208 may control the process pressure to a set point between 0.5 and 10 mTorr. The RF power source 204 may apply power to an electrode 210 that may be disposed above the polymeric substrate 104.

The RF power source 206 may provide power to the electrode 210 to sufficiently ionize the nitrogen-argon gas mixture to generate a plasma that may include, but is not limited to, atomic nitrogen (N), diatomic nitrogen ($N_2$), atomic nitrogen ions ($N^+$), diatomic nitrogen ions ($N_2^+$), metastable nitrogen ($N^*$, $N_2^*$), etc. Following the conditioning process, the polymeric substrate 104 may be moved in-situ to the PVD chamber 102 to deposit the metal layer as described above in the description of FIG. 1.

The plasma chamber 200 may be implemented in several different ways that may include, but is not limited to, capacitive coupling, inductive coupling, microwave sources, electron cyclotron resonance, and/or radial line slot antenna sources. Accordingly, the plasma chamber 200 may configured to use the techniques that are known in the art. For example, the electrode 210 may include, but is not limited to, parallel plate electrodes for capacitive coupling, loop or helical antenna or coil for inductive coupling, and so on.

In another embodiment, the plasma etch chamber 200 or a gas cluster ion beam tool (not shown) may generate a nitrogen plasma that may include, but is not limited to, atomic nitrogen (N), diatomic nitrogen ($N_2$), atomic nitrogen ions ($N^+$), diatomic nitrogen ions ($N_2^+$), metastable nitrogen ($N^*$, $N_2^*$), etc. that may direct the ions at the polymeric substrate 104. This nitrogen plasma may be generated by a modified plasma chamber (not shown) that may be able to control the sheath boundary layer potential close to the substrate. In this way, the nitrogen ions within the modified plasma chamber may be directed towards the polymeric layer when the sheath potential is adjusted. In another embodiment, a nitrogen ion beam may be produced containing, but not limited to, the species identified above. The ion beam may be generated by a bucket-type (Kaufman) ion source, or by a gas cluster ion beam tool (not shown). The ion beam may be used to modify the polymeric layer at the nano-scale level, by an energetic flux of ions.

Figure 3:
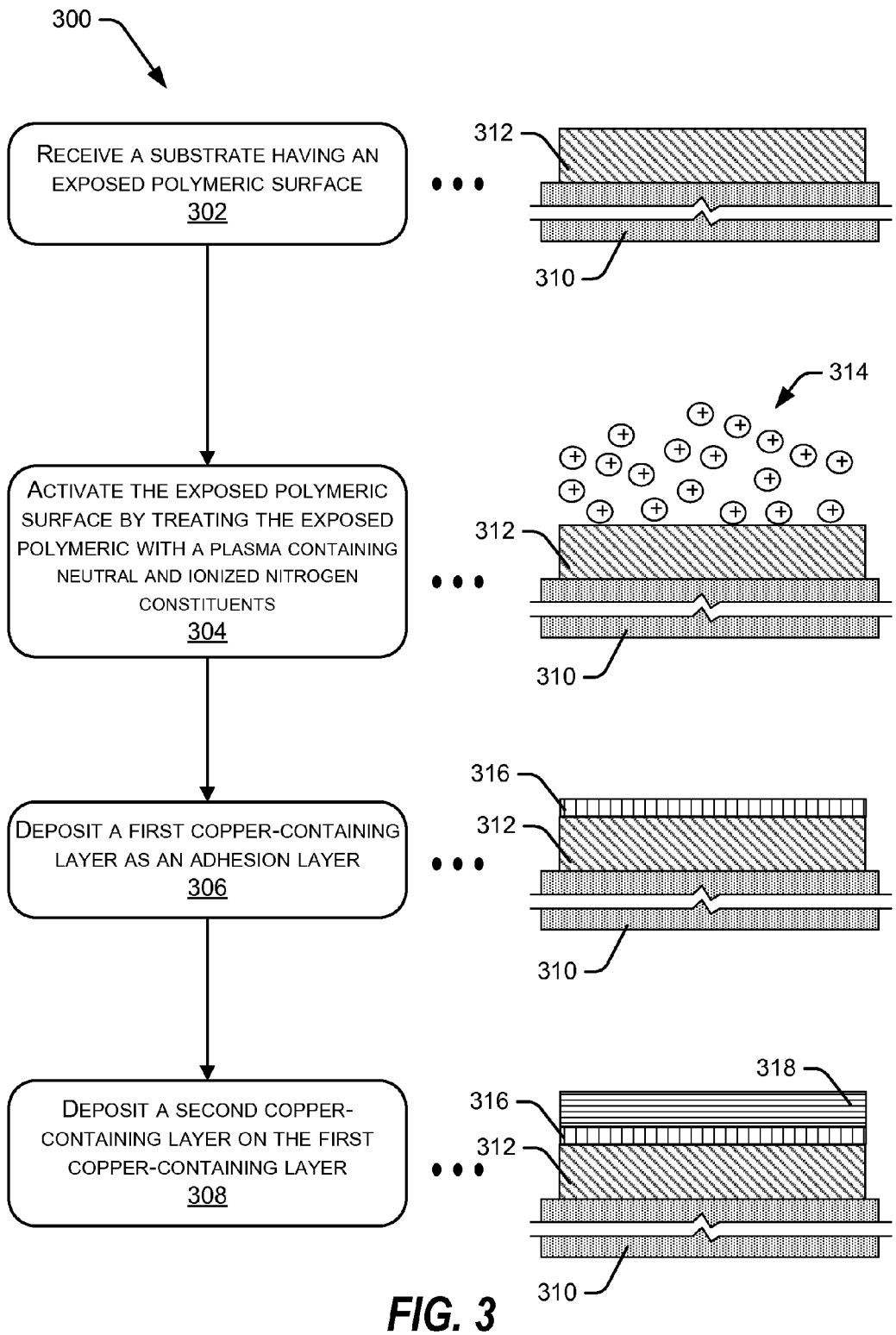
FIG. 3 illustrates a flow diagram for a method for depositing a metal layer on a polymeric substrate and includes representative cross sections of the polymeric substrate during the implementation of the method.

FIG. 3 illustrates a method flow diagram 300 for depositing a metal layer 318 on a substrate 310 that may include a polymeric layer 312. To the right of the method flow diagram 300 are representative illustrations one or more steps that may be implemented by the method. Broadly, the method may be used to increase metal adhesion of the polymeric layer 312. The method may include a first step that may condition the polymeric layer to increase metal adhesion and a second step that may deposit metal (e.g., copper) onto the conditioned polymeric layer 312. The method flow diagram 300 is one example of how the method may be implemented. In other embodiments, the steps of the method may be performed in a different order and/or one or more of the steps may be omitted. In one specific embodiment, the conditioning and metal deposition may occur concurrently in a manner that adjusts the concentration of nitrogen and copper in the PVD chamber 102 over time.

Turning to the method 300, at block 302, the substrate chuck 106 may receive the substrate 310 that may be an exposed polymeric layer 312 or surface. In one embodiment, the substrate may include, but is not limited to, a silicon substrate, a gallium-arsenide substrate, or any other semiconductor substrate. In one specific embodiment, the substrate may include an electronic device (not shown) that may use the polymeric layer 312 as a protective layer against electromagnetic interference (EMI). The electronic device may be packaged in a molding that electrically isolates the electronic device from the environment, or vice versa, except along paths (e.g., leads or solder points) that may be intended to carry current to or from the electronic device. The electrical isolation may include, but is not limited to, electromagnetic signals generated by other devices or components that are not intended to be integrated into the operation of the electronic device. Shielding of the electronic device may be accomplished by at least partially encapsulated the packaged electronic device with a metal layer that may be coupled to electrical ground. The shielding may also shield noise generated by the shielded device from other devices or components.

In one embodiment, a plurality of packaged electronic devices may be carried by and/or processed in a tray (e.g., JEDEC (Joint Electron Device Engineering Council) standard tray). The batch processing of several packaged electronic devices at the same time may reduce cycle time and production cost.

The polymeric layer 312 may include, but is not limited to, an epoxy resin that may be polymeric or semi-polymeric. The epoxy may include a resin component and a hardener component that when mixed together may bond to form a solid material. In one specific embodiment, the polymeric layer may include a silicone impregnated epoxy. In general, the polymeric layer 312 may have poor intrinsic metal adhesion properties that may cause applied metal layers to peel or separate from the polymeric layer 312. Accordingly, the polymeric 312 may use a conditioning process to increase its metal adhesion capability.

At block 304, the PVD chamber 102 or the plasma etch chamber 200 may activate the exposed polymeric layer 312 by treating the exposed polymeric layer 312 with argon-nitrogen plasma 314. The activation may include, but is not limited to, altering the surface energy or surface states of the polymeric layer in a way that will make adhesion of metal or copper to the polymeric layer 312 more likely. In one instance, the surface of the polymeric layer 312 may include altered or additional bonds that may adhere more strongly with copper than an unconditioned polymeric layer 312.

The conditioning may occur due to the nitrogen ions or atoms bombarding the polymeric layer 312 in an isotropic and/or anisotropic manner. The nitrogen ions may alter or activate the surface. In any event, the bombarded or embedded surface may create at least a portion of an adhesion layer 316 that may facilitate the adhesion of a metal layer. The overlying copper layer may be at least 0.2 um. In one specific embodiment, the adhesion layer 316 range between 300 A and 800 A that may accommodate an overlying copper layer with a target thickness between 0.2 μm to 12 μm.

At block 306, the PVD chamber 102 may deposit a first copper-containing layer as an adhesion layer 316 of copper on the exposed polymeric layer 312 after having been activated using nitrogen-containing plasma 314. For example, the method may include introducing a first process gas containing a noble gas and nitrogen-containing gas and sputtering copper from a copper target (e.g., metal source 114) operated at a first power condition equal to or less than 2 W per cm2. The nitrogen-containing gas may include a nitrogen-argon mixture wherein the concentration of nitrogen ranges between 1% to 50%. In one specific embodiment, the nitrogen mixture may be about 5% to adhere a copper layer of up to 3 μm. In other embodiments, the nitrogen concentration may be a higher percentage for thicker metal stacks. The nitrogen concentration may also be optimized for other materials that may be deposited on top of those metals stacks. In one embodiment, the concentration of nitrogen and argon gas is controlled by the gas flow rates into the chamber (e.g., Ar 116, $N_2$ 118) as shown at least FIG. 1. However, the concentration of gas may also be controlled by other means that may include, but is not limited to, sampling PVD chamber 102 to determine the amount of $N_2$ and Ar that is present.

In one embodiment, the activating of the exposed polymeric layer 312 occurs in a first processing chamber (e.g., plasma etch chamber 200) and the deposition of the first copper-containing layer occurs in a second processing chamber (e.g., PVD chamber 102). In this instance, the substrate 102 may be moved from the plasma etch chamber 200 to the PVD chamber 102 without exposure to ambient atmospheric conditions to enable the deposition of the second copper containing layer (e.g., metal layer 318). However, in another embodiment, the PVD chamber 102 may activate the polymeric layer 312 and deposit the first copper-containing layer 316.

At block 308, the PVD chamber 102 may deposit a second copper-containing layer (e.g., metal layer 318) on the first copper-containing layer (e.g., adhesion layer 316) via a physical vapor deposition process. The second copper-containing layer may include a higher concentration of copper than the first copper-containing layer. Stated another way, the first copper containing layer may have a higher nitrogen concentration than the second copper-containing layer. The second copper-containing layer may also be thicker than the first copper-containing layer.

In one specific embodiment, the first copper-containing layer and the second copper-containing layer occurs as a single continuous deposition process. For example, both layers may be deposited in the same PVD chamber 102 by adjusting the process conditions (e.g., gas flow, power, etc.) to change the copper concentration of the film being deposited on the substrate 310. In one instance, the process changes may include lowering the nitrogen concentration and increasing the power applied to the target 114. This may result in the nitrogen concentration transitioning from a relatively higher concentration to a lower or zero concentration with increasing thickness. The nitrogen concentration in the metal stack may decrease as the distance from the polymeric layer 312 increases. In this way, the activating or exposing of the polymeric layer 312 and the depositing of the copper may be performed concurrently or simultaneously.

The adhesion of the polymeric layer 312 and the first and/or second copper containing layers 316, 318 may also be adjusted by controlling or modifying the stress in the copper layers. In PVD sputtering systems, this can be modulated by varying the gas pressure during the process where in general the trend is transitioning from tensile to compressive film stress as gas pressure is lowered and ion bombardment increases. This effect can also be achieved in cases where unbalanced magnetrons are used or where applied substrate biases are possible. Extrinsic factors affecting stress (and possibly adhesion at metal-polymer interfaces) such as in-service temperature range of the device, properties of the polymer (thermoset versus thermoplastic) and in-service mechanical stresses (tension, compression, torsion, etc. . . . ) should be considered in tailoring the proper intrinsic film stress for the application.

Figure 4:
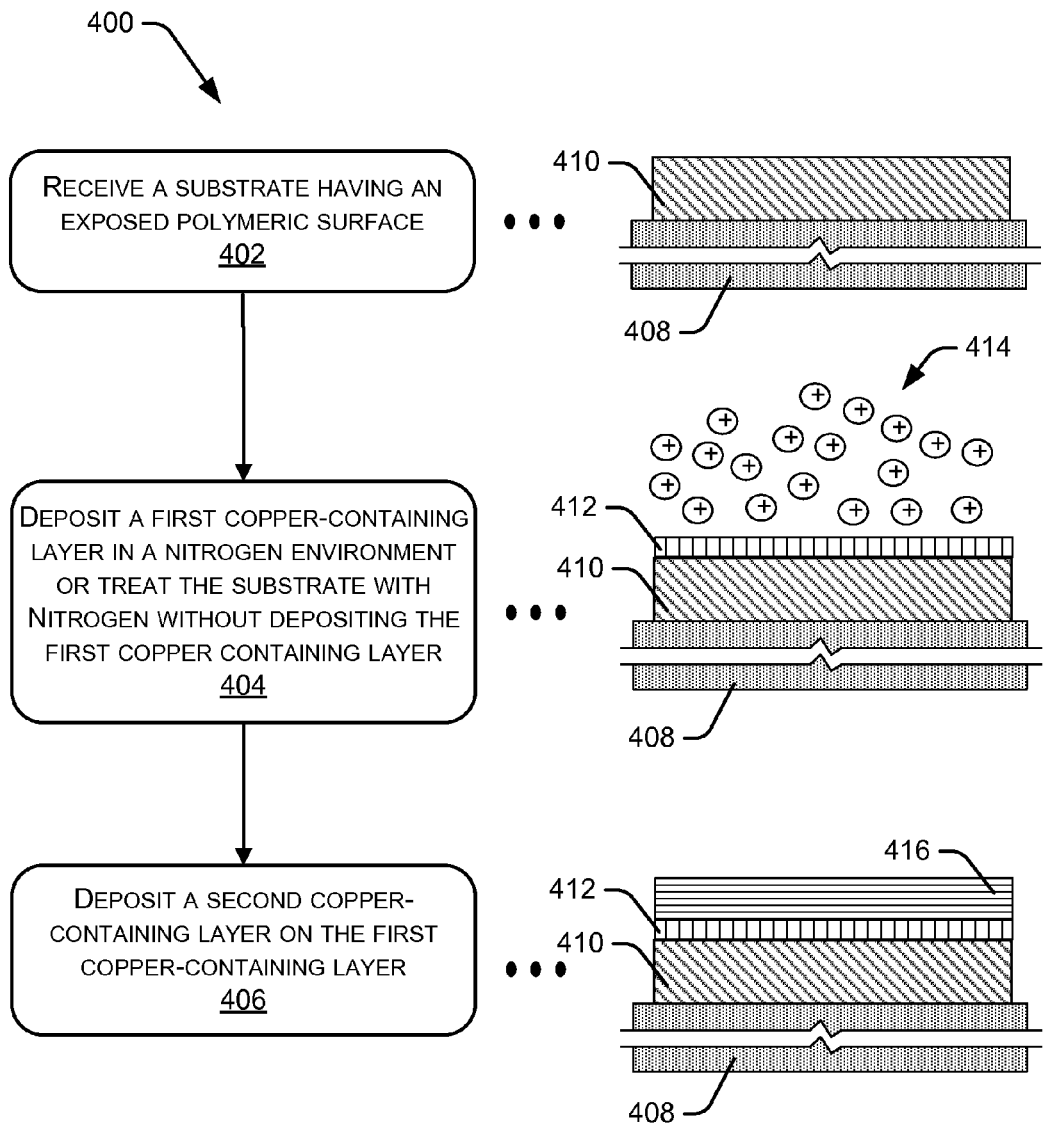
FIG. 4 illustrates another flow diagram for a method for depositing a metal layer on a polymeric layer and includes representative cross sections of the polymeric substrate during the implementation of the method.

FIG. 4 illustrates another method 400 for depositing a metal layer (e.g., copper layer 416) on a polymeric substrate 408 and includes representative cross sections of the polymeric substrate 408 during the implementation of the method 400. In other embodiments, the steps of the method may be performed in a different order and/or one or more of the steps may be omitted. In one specific embodiment, the conditioning and metal deposition may occur concurrently in a manner that adjusts the concentration of nitrogen and copper in the PVD chamber 102 over time.

At block 402, the PVD chamber 102 may receive a substrate 408 with an exposed polymeric surface. The PVD chamber 102 may generate a vacuum and expose the substrate to sub-atmospheric conditions. For example, the pressure may range between 1 mTorr to about 20 mTorr. In one specific embodiment, the pressure may include a set point between 2 mTorr to about 15 mTorr.

At block 404, the PVD chamber 102 may deposit a first copper-containing layer 412 directly on the exposed polymeric surface 408 in a first nitrogen-containing environment that may include nitrogen plasma 414. The deposition process may include, but is not limited to, introducing a first process gas mixture containing a noble gas and nitrogen-containing gas. In one specific embodiment, the noble gas may be argon and may make up to at least 50% of the gas mixture. The PVD chamber 102 may also sputter copper from a copper target 114 operated at a first power condition that includes a sputtering power per unit area of substrate equal to or less than 2 W per cm2. The target thickness of the first copper-containing layer ranges from about 10 Angstroms to about 500 Angstroms. The first copper-containing layer 412 is CuNx, wherein x is a non-zero real number.

At block 406, the PVD chamber 102 may deposit a second copper-containing layer 416 on the first copper-containing layer 412. The deposition process may include, but is not limited to, introducing a second process gas containing a noble gas. In one specific embodiment, the noble gas may include argon. The PVD chamber 102 may also sputter copper from the copper target 114 operated at a second power condition that includes a sputtering power per unit area of substrate greater than 2 W per cm2. The thickness of the second copper-containing layer may exceed about 1 micron. In one specific embodiment, the second copper-containing layer 416 is substantially copper.

Figure 5:
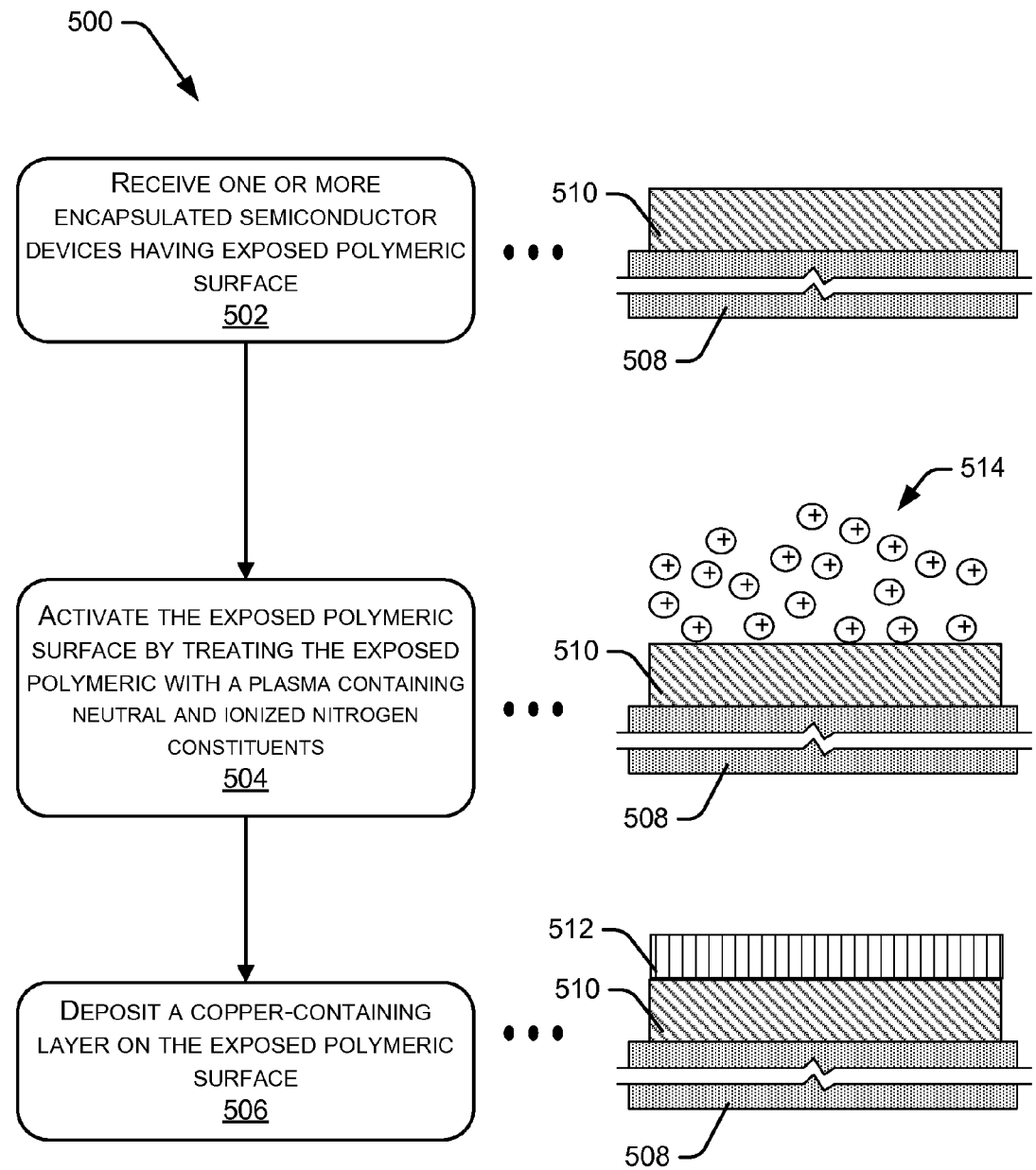
FIG. 5 illustrates a flow diagram for a method for treating a polymeric layer prior to depositing a metal layer on the polymeric layer and includes representative cross sections of the polymeric substrate during the implementation of the method.

FIG. 5 illustrates a flow diagram 500 for a method for treating a substrate with a polymeric layer prior to depositing a metal layer on the polymeric layer. The substrate may include a packaged electronic device 508 that may be encapsulated or covered by the polymeric layer 510. The packaged electronic device 508 may have electrical leads (not shown) or ball solder joints (not shown) that may enable the packaged electronic device 508 to be electrically coupled with a printed circuit board or another electronic device. The copper layer 512 that is deposited over the packaged electronic device 508 may provide EMI shielding and may be coupled to electrical ground (not shown). Electromagnetic energy that may cause electrical interference when intercepted by the packaged electronic device may be directed to ground by the copper layer 512.

At block 502, the packaged electronic device 508 comprising a polymeric layer 510 or material may be provided to the etch chamber 200. In one embodiment, the polymeric material 510 comprises an epoxy resin or a silicone impregnated epoxy that substantially covers the packaged electronic device 508. The polymeric layer 510 may be used as an adhesion layer for subsequent layers deposited on the packaged electronic device 508. In certain instances, the adhesion layer may be conditioned or pre-treated to increase the adhesion between the polymeric layer 510 and the subsequent deposited layer.

At block 504, the polymeric layer 510 may be exposed to a plasma comprising nitrogen-containing species generated by the etch chamber 200. The nitrogen-containing species, may include but not limited to, atomic nitrogen (N), diatomic nitrogen ($N_2$), atomic nitrogen ions ($N^+$), diatomic nitrogen ions ($N_2^+$), metastable nitrogen ($N^*$, $N_2^*$), etc. The plasma may be generated by introducing nitrogen (N2) gas into the etch chamber 200 at sub-atmospheric pressure and energizing the gas using power provided by the RF power source 204. The nitrogen ions or atoms may be directed towards the polymeric layer 510 and may roughen the surface and/or alter the chemical composition of the exposed polymeric layer 510. The resulting surface roughness and/or chemical composition may increase the adhesion affinity with the subsequent layer (e.g., copper layer 512).

In one embodiment, the plasma may be generated using sub-atmospheric process conditions between 0.5 and 10 mTorr. Nitrogen or a combination of nitrogen and another noble gas (e.g., >25% Ar) may be introduced into the etch chamber 200 at pressure. The etch chamber 200 may include an RF electrode that may distribute power across the etch chamber 200. The power may interact with the gas to form monatomic nitrogen ions ($N^+$) by splitting the $N_2$ molecules and displacing electrons from the monatomic nitrogen. The plasma may bombard the polymeric layer 510 in an isotropic or anisotropic manner.

At block 506, a copper layer 512 may be deposited on the exposed polymeric layer 510 using sputtering techniques. In one embodiment, the copper layer 512 may be deposited using a physical vapor deposition (PVD) process using the sputter chamber 102 as described in the description of FIG. 1.

In one embodiment, the sputtering process may include providing a gas mixture of a noble gas (e.g., Ar) and nitrogen into the sputter chamber 102. A magnetron (e.g., power source 108) may provide power to the sputter chamber 102 to sputter metal from metal target 114 inside the sputter chamber 102 onto the polymeric layer 510. In one specific embodiment, the power provided by the magnetron may be greater than 1 $W/cm^2$. The copper layer 512 may range in thickness between 1 and 15 um.

It should be understood that the foregoing description is only illustrative of the invention. Various alternatives and modifications can be devised by those skilled in the art without departing from the invention. Accordingly, the present invention is intended to embrace all such alternatives, modifications and variances that fall within the scope of the appended claims.

The invention claimed is:

1. A method for adhering copper to a polymeric material, comprising:
    exposing a substrate to a nitrogen-containing environment to increase adhesion of first and second copper-containing layers to the substrate, the substrate comprising a tray of semiconductor devices that are at least partially covered with polymeric material;
    depositing, at a first power level, the first copper-containing layer onto the polymeric material surface present on the substrate; and
    depositing, at a second power level, the second copper-containing layer onto the first copper-containing layer, wherein the second power level is greater than the first power level.

2. The method of claim 1, wherein the depositing and exposing are performed concurrently.

3. The method of claim 1, wherein the exposing is performed prior to the depositing the first and second copper-containing layers.

4. The method of claim 1, wherein the first copper-containing layer comprises CuNx proximate to the polymeric surface that transitions to substantially Cu as the second copper-containing layer is deposited to achieve a target layer thickness.

5. The method of claim 1, wherein the first copper-containing layer comprises CuNx, and wherein the nitrogen content of the second copper-containing layer decreases with distance from the polymeric surface.

6. The method of claim 1, wherein the substrate comprises an encapsulated electronic device that can be coupled to a printed circuit board or another electronic device.

7. The method of claim 1, wherein the depositing the first and second copper-containing layers includes performing a physical vapor deposition (PVD) process.

8. The method of claim 1, wherein the exposing includes exposing the polymeric surface to a nitrogen-containing plasma.

9. The method of claim 1, wherein the exposing includes exposing the polymeric surface to a nitrogen or nitrogen-containing ion beam.

10. A method for depositing a metal layer on a packaged electronic device, the method comprising:
receiving the packaged electronic device comprising an exposed polymeric surface;
applying a nitrogen-containing plasma to the exposed polymeric surface;
depositing, at a first power level, a first copper-containing layer on the exposed polymeric surface after having been activated using the nitrogen-containing plasma; and
depositing, at a second power level, a second copper-containing layer onto the first copper-containing layer,
wherein the second power level is greater than the first power level.

11. A method for depositing a metal layer on a packaged electronic device, comprising:
receiving a packaged electronic device comprising an exposed polymeric material;
activating the exposed polymeric material by treating the exposed polymeric material with a nitrogen-containing plasma;
depositing, at a first power level, a first copper layer on exposed polymeric material via a physical vapor deposition process, the first copper layer providing electromagnetic shielding for the packaged electronic device; and
depositing, at a second power level, a second copper layer onto the first copper layer,
wherein the second power level is greater than the first power level.

12. The method of claim 11, wherein activating the exposed polymeric material occurs in a first processing chamber, and wherein depositing the first and second copper layers occurs in a second processing chamber.

13. The method of claim 12 wherein the first processing chamber comprises an etching chamber that includes an electrode or an antenna, and wherein the second processing chamber comprises a physical vapor deposition chamber that includes a magnetron.

14. The method of claim 11, wherein treating the exposed polymeric material with the nitrogen plasma includes isotropically bombarding the exposed polymeric material with the nitrogen plasma comprising nitrogen-containing species, including but not limited to, atomic nitrogen (N), diatomic nitrogen ($N_2$), atomic nitrogen ions ($N^+$), diatomic nitrogen ions ($N_2^+$), or metastable nitrogen ($N^*$, $N_2^*$).

15. The method of claim 11, wherein treating the exposed polymeric material with nitrogen plasma includes anisotropically bombarding the exposed polymeric material with the nitrogen plasma comprising nitrogen-containing species, including but not limited to, atomic nitrogen (N), diatomic nitrogen ($N_2$), atomic nitrogen ions ($N^+$), diatomic nitrogen ions ($N_2^+$), or metastable nitrogen ($N^*$, $N_2^*$).

16. The method of claim 11, wherein the depositing the first copper layer comprises performing a physical vapor deposition (PVD) process that includes:
introducing a first process gas containing a noble gas and nitrogen-containing gas; and
sputtering copper from a copper target operated at a power condition that includes a sputtering power per unit area equal to or greater than 1 W per cm2.

17. The method of claim 11, wherein activating the exposed polymeric material further comprises mixing argon with the nitrogen plasma, the mixture comprising at least 25% argon.

18. The method of claim 11, wherein the encapsulated semiconductor devices comprise metal contacts that can be coupled to circuitry that is external to the packaged electronic device.

19. The method of claim 11, wherein the polymeric material comprises an epoxy resin or a silicone impregnated epoxy.

20. The method of claim 11, wherein the packaged electronic device comprises electrical leads or ball contacts.

* * * * *